United States Patent

[11] 3,577,038

[72] Inventor Charles R. Cook, Jr.
North Palm Beach, Fla.

[21] Appl. No. 757,438
[22] Filed Sept. 4, 1968
Division of Ser. No. 595,532, Nov. 18, 1966, abandoned, which is a Continuation of Ser. No. 221,409, Aug. 31, 1962, abandoned
[45] Patented May 4, 1971
[73] Assignee Texas Instruments Incorporated
Dallas, Tex.

[54] SEMICONDUCTOR DEVICES
9 Claims, 28 Drawing Figs.

[52] U.S. Cl. 317/101, 317/234, 29/577
[51] Int. Cl. H01l 19/00
[50] Field of Search 317/101 (A), 235/22; 29/(Inquired)

[56] References Cited
UNITED STATES PATENTS
2,655,525 10/1953 Burton 317/101A(UX)
2,981,877 4/1961 Noyce 317/235.22(UX)
3,100,276 8/1963 Meyer 317/101A(UX)
3,150,299 9/1964 Noyce 317/101A(UX)
3,158,788 11/1964 Last 317/101A(UX)
3,303,400 2/1967 Allison 317/101A(UX)

*Primary Examiner*—David Smith, Jr.
*Attorney*—Melvin Sharp

ABSTRACT: A large number of different types of circuits made from a single semiconductor wafer configuration by varying the manner in which connections and leads are provided to the various regions of the wafer. A plurality of different circuit elements such as transistors, diodes, resistors and capacitors, are formed in a wafer semiconductor material, preferably by diffusion into the surface of a major wafer. These elements are arranged in a pattern adjacent the major face, with each region or electrode of each element coming to the surface at this face so that electrical connection may be made thereto. An insulating coating is provided on the major face of the wafer, with holes being formed in the coating where contacts are to be made, and conductive material is preferably deposited first over the entire face of the wafer and is later removed in a selected pattern to create the interconnections between components necessary for the selected circuit.

PATENTED MAY 4 1971 3,577,038

SHEET 1 OF 9

Charles R. Cook, Jr.
INVENTOR

BY [signature]
ATTORNEY

Charles R. Cook, Jr.
INVENTOR

BY

ATTORNEY

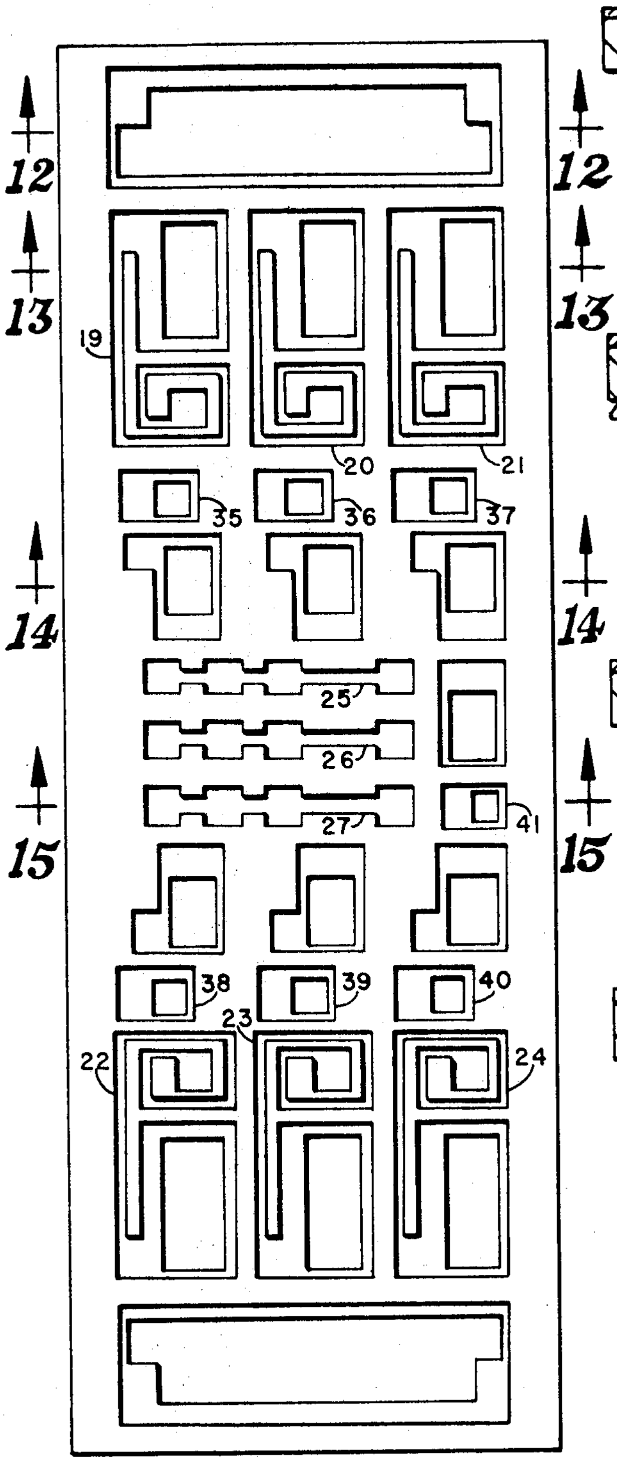
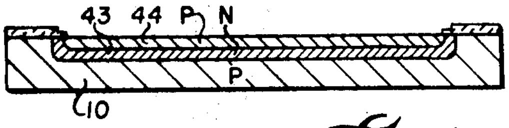
Fig. 12
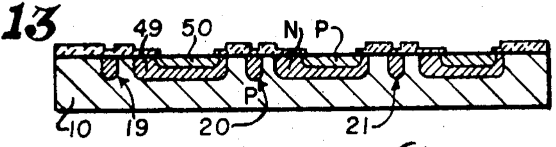
Fig. 13
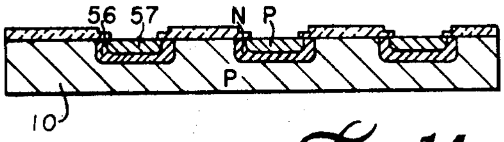
Fig. 14
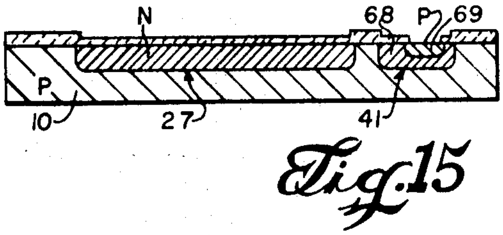
Fig. 15
Fig. 11
Charles R. Cook, Jr.
INVENTOR
BY
ATTORNEY Charles R. Cook, Jr
INVENTOR

BY

ATTORNEY

Charles R. Cook, Jr.
INVENTOR
BY [signature]
ATTORNEY

Charles R. Cook, Jr.
INVENTOR

BY

ATTORNEY

Charles R. Cook, Jr.
INVENTOR
BY [signature]
ATTORNEY

Charles R. Cook, Jr
INVENTOR
BY [signature]
ATTORNEY

Charles R. Cook, Jr.
INVENTOR

BY

ATTORNEY

SEMICONDUCTOR DEVICES

This application is a Divisional Application of copending patent application, Ser. No. 595,532, filed Nov. 18, 1966, now abandoned, which is a continuation of application, Ser. No. 221,409, filed Aug. 31, 1962, now abandoned.

This invention relates to semiconductor networks or integrated circuits, and more particularly relates to the fabrication of versatile, multipurpose semiconductor wafers containing a variety of diverse semiconductor components from which many different integrated circuits may be produced.

Semiconductor networks, or integrated circuits, are small monolithic wafers or crystals of semiconductor material containing several circuit elements such as transistors, diodes, resistors and capacitors. The elements are connected together to form an electronic circuit having a selected function by internal paths through the crystal, or by leads external to the crystal, interconnecting various regions of the circuit elements. These techniques result in extremely small devices which perform functions equivalent to that of entire electronic circuits, providing a size reduction of several orders of magnitude compared to printed circuitry or to the so-called micromodule approach. Wide commercial utilization of semiconductor network techniques has been somewhat hampered, however, due to the cost of the circuit devices. Heretofore, a different type of crystal wafer for each different circuit to be fabricated had to be individually constructed. For example, integrated multivibrator circuits were made from semiconductor wafers containing the specific circuit elements needed for this particular circuit, while amplifiers were made from wafers containing an entirely different group of circuit elements, and logic circuits made from still another type of wafer. Thus, each different circuit required completely different sets of production specifications and equipment, including masks for photoresist operations, intermediate testing procedures, etc. This would mean that a large part of the unit price of an integrated circuit would result from the engineering costs of creating the apparatus and specifications needed for production and from the costs of the many production lines necessary to produce a variety of different circuits.

It is therefore the principal object of this invention to provide an improved fabrication technique for semiconductor networks or integrated circuits. Another object is to provide a semiconductor device in the form of a master wafer from which a large variety of integrated circuits may be constructed. A further object is to provide semiconductor network devices at lower unit costs by using mass production techniques.

In accordance with this invention, a large number of different types of circuits may be made from a single semiconductor wafer configuration by varying the manner in which connections and leads are provided to the various regions of the wafer. A plurality of different circuit elements such as transistors, diodes, resistors and capacitors, are formed in a wafer of semiconductor material, preferably by diffusion into the surface of a major face of the wafer. These elements are arranged in a pattern adjacent the major face, with each region or electrode of each element coming to the surface at this face so that electrical connection may be made thereto. An insulating coating is provided on the major face of the wafer, with holes being formed in the coating where contacts are to be made, and conductive material is deposited on top of the insulating coating. This conductive material is preferably deposited first over the entire face of the wafer and is later removed in a selected pattern to create the interconnections between components necessary for the selected circuit.

The novel features believed characteristic of this invention are set forth in the appended claims. The invention itself, however, along with further objects and advantages thereof, may best be understood from the following detailed description of an illustrative embodiment, when read in conjunction with the accompanying drawing, wherein:

FIG. 1 is a top view of a master semiconductor wafer having a plurality of circuit elements formed therein;

FIGS. 2—5 are sectional views of the wafer of FIG. 1 taken through the lines 2-2, 3-3, 4-4, and 5-5, respectively;

FIG. 6 is a top view of the wafer of FIG. 1 in an early stage of manufacture after the oxide mask for the first diffusion has been formed;

FIGS. 7—10 are sectional views of the wafer of FIG. 6 after the first diffusion taken through the lines 7-7, 8-8, 9-9, and 10-10, respectively;

FIG. 11 is a top view of the wafer of FIG. 6 after additional manufacturing steps have been performed to provide the oxide mask for the second diffusion;

FIGS. 12—15 are sectional views of the wafer of FIG. 11 after the second diffusion taken through the lines 12-12, 13-13, 14-14, and 15-15, respectively;

FIG. 16 is a top view of the wafer of FIG. 11 after the oxide mask for the final diffusion step has been provided;

FIGS. 17—20 are sectional views of the wafer of FIG. 16 after the final diffusion taken through the lines 17-17, 18-18, 19-19 and 20-20, respectively;

Figure 1:
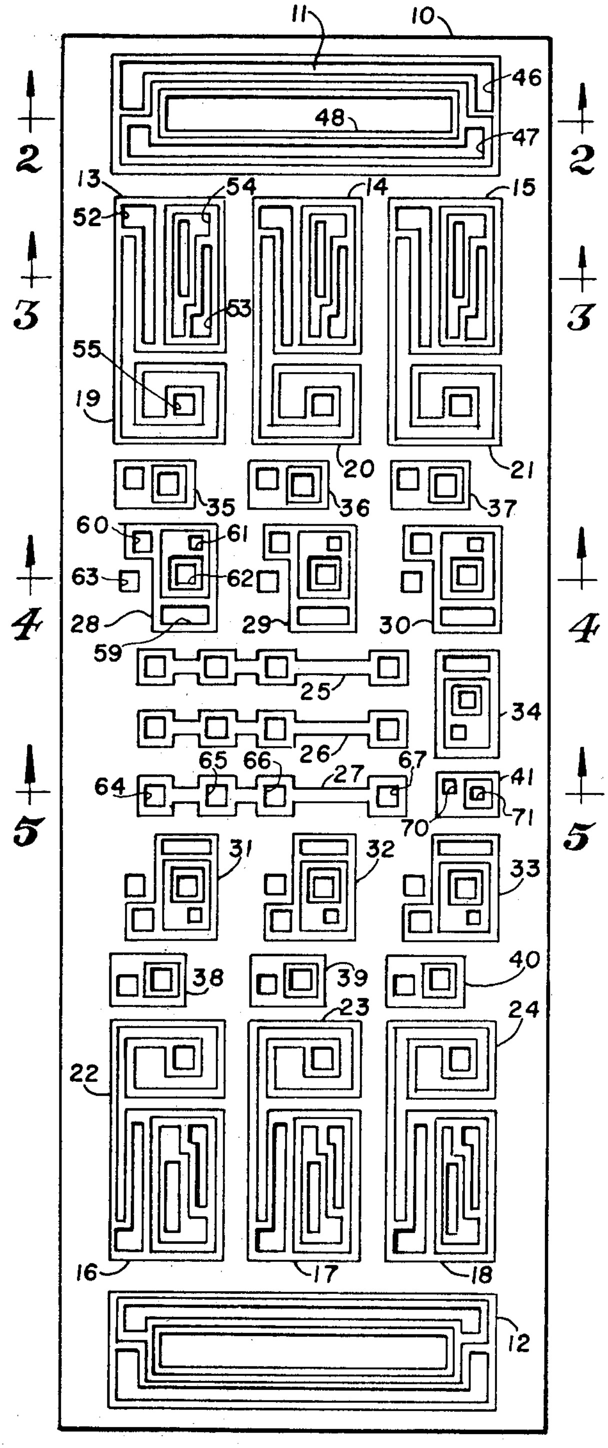

With reference to FIG. 1, a semiconductor wafer 10 is shown having a plurality of transistors, diodes, resistors and capacitors formed therein. This wafer 10 may be used to provide any of several different circuits, depending upon the contact and lead configuration, and so is referred to as a master wafer. Only the wafer of semiconductor material with junctions formed therein is seen in FIG. 1, the contacts and leads being described hereinafter. The circuit elements provided in the wafer 10 are formed by diffusion into extrinsic semiconductor material, the transistors and capacitors being of the triple-diffused type, the diodes double-diffused, while the resistors are formed by a single diffusion.

Specifically, the wafer 10 includes a pair of relatively large PN junction capacitors 11 and 12 at opposite ends, plus six somewhat smaller capacitors 13—18 positioned next to the ends, each of the latter being integrally connected to one of six spiral-shaped, semiconductor resistors 19—24. Three more resistors 25, 26 and 27 are at the center of the wafer, these having a plurality of taps or contact points so that their values can be selected. In addition, seven NPN transistors 28—34 are provided in the wafer, as well as seven diodes 35—41. As seen in the cross-sectional views of FIGS. 2—5, all of the elements are formed in the planar fashion with dish-shaped junctions exposed only on the top surface of the wafer 10, these junctions being protected by an oxide coating 42. Holes are provided in the oxide coating where contacts may be made to each possible electrode of each of the circuit elements.

Figure 2:
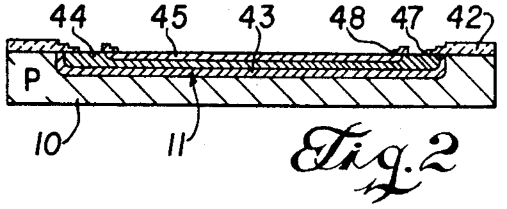
Figure 3:
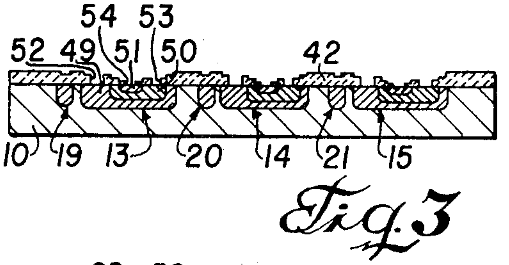
Figure 4:
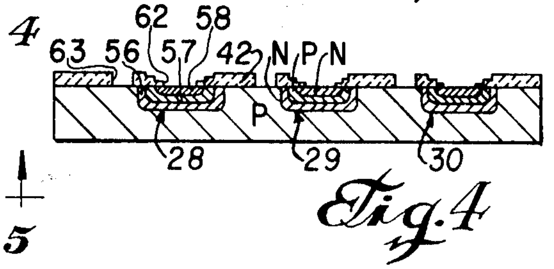
Figure 5:
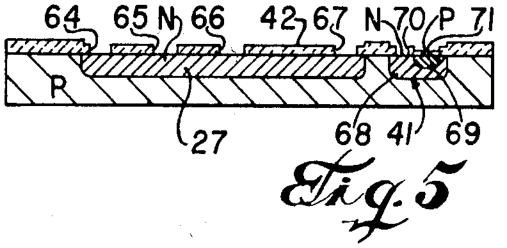

All of the capacitors are of the same general form as the capacitor 11 seen in FIGS. 1 and 2, which comprises a lower N-type region 43, in intermediate P-type region 44, and an upper N-type region 45. Contacts to the regions 43—45 are made through holes 46—48, respectively, provided in the oxide layer 42. The two N-type regions 43 and 45 are usually connected together externally to form one electrode of the capacitor, while the P-type region 44 forms the other electrode. The capacitor 12 is of exactly the same form as the capacitor 11. The capacitor 13 is the same as the capacitor 11 in that it includes interleaved regions 49, 50 and 51 of opposite conductivity-types and holes 52, 53 and 54 formed in the oxide layer 42 to make contacts to these regions. The N-type region 49, however, is integrally connected to one end of the elongated, spiral-shaped N-type region which forms the resistor 19. The hole 52 thus forms a common contact area for one end of the resistor 19 and one electrode of the capacitor 13. The other end of the resistor 19 is contacted through a hole 55 in the oxide coating.

All of the transistors in the wafer 10 are similar, the transistor 28, for example, being comprised of a diffused N-type collector region 56, a P-type base region 57, and an N-type emitter region 58. The collector region is contacted through either of a pair of holes 59 and 60 formed in the oxide coating 42, while the base and emitter are contacted through holes 61 and 62, respectively. Another hole 63 is provided for making contact to the P-type substrate adjacent the transistor 28.

The resistor 27 is seen to be comprised of an elongated N-type region with four contact holes 64—67. The diode 41, just as all of the diodes in the wafer 10, includes a lower N-type region 68 and an upper P-type region 69, with contacts being made to these regions through holes 70 and 71, respectively.

A master wafer as seen in FIGS. 1—5 would be used to provide a variety of circuits by forming a lead pattern between selected ones of the circuit components on the wafer as described hereinafter. First, an example of a manner in which the master wafers could be fabricated will be given.

Figures 6, 7, 8, 9, 10:
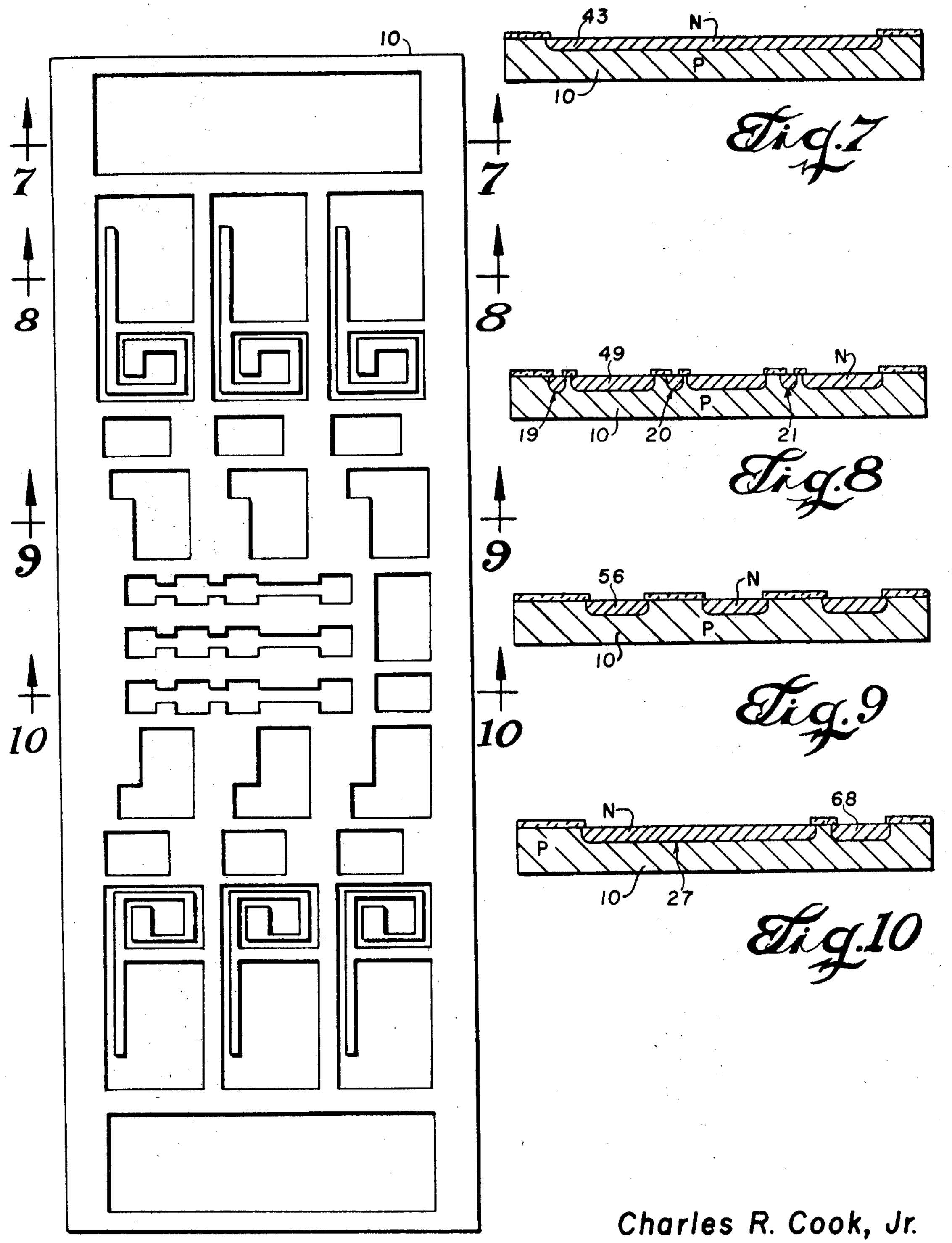

A suitable method for fabricating the device of FIGS. 1—5 would be to start with a slice of P-type silicon which has been doped in growing with boron to provide a resistivity of 10 to 15 ohm-cm. The slice would be about 10 mils thick and would have lateral dimensions adequate to allow several, perhaps 25 of the wafers 10 of FIG. 1 to be fabricated simultaneously. The entire top surface of the slice, including as a portion thereof the wafer 10, after being prepared by polishing, etching, and cleaning, is exposed to steam while being heated to provide an oxide coating thereon. Conventional photoresist masking and etching techniques are used to remove the oxide coating in a pattern as seen in FIG. 6. This exposes the outlines of the transistor collectors, the cathodes of the diodes, the resistors, and one electrode of each of the capacitors. A first N-type diffusion is then performed by depositing phosphorus on the top surface of the silicon slice and then heating at diffusion temperature for a time adequate to provide a junction depth of about one-half mil. This may be a temperature of 1225° C. for about 20 hours, although the specific times and temperatures would depend upon the method used to deposit the phosphorus and the appropriate junction depth. This first diffusion forms the region 43 for what will be the capacitor 11, the region 49 for the capacitor 13, the resistors 19—27, the collector region 56 for the transistor 28, and the cathode region 68 for the diode 41, as well as the corresponding regions for the other elements.

Another coating of oxide is formed over the previously exposed areas during or after the first diffusion step, and portions of this oxide are now removed by another photoresist masking and etching operation. A pattern of openings is provided on the top surface of the wafer as seen in FIGS. 11—15, exposing the outlines of the transistor bases, the anodes of the diodes, and the center portion of each of the capacitors. A P-type diffusion is performed by depositing boron on the top surface of the wafer 10 and then heating for perhaps two hours at 1200° C. to diffuse boron into the regions not masked by oxide. The junction depth should be about 0.15 mils, for example. This P-type diffusion creates the region 44 for the capacitor 11, the region 50 for the capacitor 13, the base region 57 for the transistor 28, and the anode region 69 for the diode 41, along with similar regions in the remaining components.

Still another oxide coating is formed during or after the P-type diffusion, and selected portions of this coating are removed by a third photoresist masking and etching operation to provide a pattern of openings as seen in FIGS. 16—20. These openings expose the outlines of the transistor emitters and the remaining electrodes of the capacitors. A second N-type diffusion is then performed by a conventional technique as above to provide a junction depth of perhaps 0.10 mil or an effective base thickness for the transistors of about 0.05 mil. This may comprise heating the wafer 10 to about 1100° C. for 70 minutes while it is exposed to oxygen and vapor from a quantity of heated phosphorus pentoxide. The second N-type diffusion operation forms the top region 45 for the capacitor 11, the top region 51 for the capacitor 13, the emitter region 58 for the transistor 28, and corresponding regions for the other capacitors and transistors. This completes the diffusions, and the remaining operations are to provide the contacts and leads.

A final oxide coating is formed during the last diffusion, and selected portions of this and previous coatings are removed by a fourth photoresist mask and etch operation to expose the areas where contacts are to be made, as seen in FIGS. 1—5. The wafers are now completed except for the contacts and leads. These are provided by evaporating aluminum over the entire top surface of the wafer and then removing the aluminum in the areas where it is not wanted. This aluminum coating is formed by placing a silicon slice including a large number of the FIG. 1 devices into an evacuable chamber, such as a bell jar and vacuum pump arrangement, on an electrical heater plate. The pressure is reduced to perhaps 1 micron, and the slice is brought up to a temperature of about 600° C. by the heater. Then aluminum is deposited on the top surface of the slice from an energized tungsten evaporation coil which is within the chamber spaced above the slice. Deposition continues for long enough to produce a film of aluminum about 10,000 A. thick covering the oxide coating on the slice and the exposed silicon in the contact areas. Since the silicon-aluminum eutectic forms at about 670° C., the slice temperature of 600° C. alone is not quite adequate to produce alloying. However, the energy of the aluminum particles striking the silicon is effective to raise the temperature of minute areas of the silicon surface to the proper level to produce a good ohmic contact between the aluminum film and the exposed silicon by microalloying. The slice is then removed from the evaporation chamber and later another photoresist masking and etching operation is performed to remove the unwanted aluminum and define the lead pattern. Up to this point, however, the manufacturing process for all of the many different circuit devices is the same, necessitating only a single set of photomasks, diffusion furnaces, testing procedures, etc., for producing many different types of semiconductor networks.

Figures 21, 22:
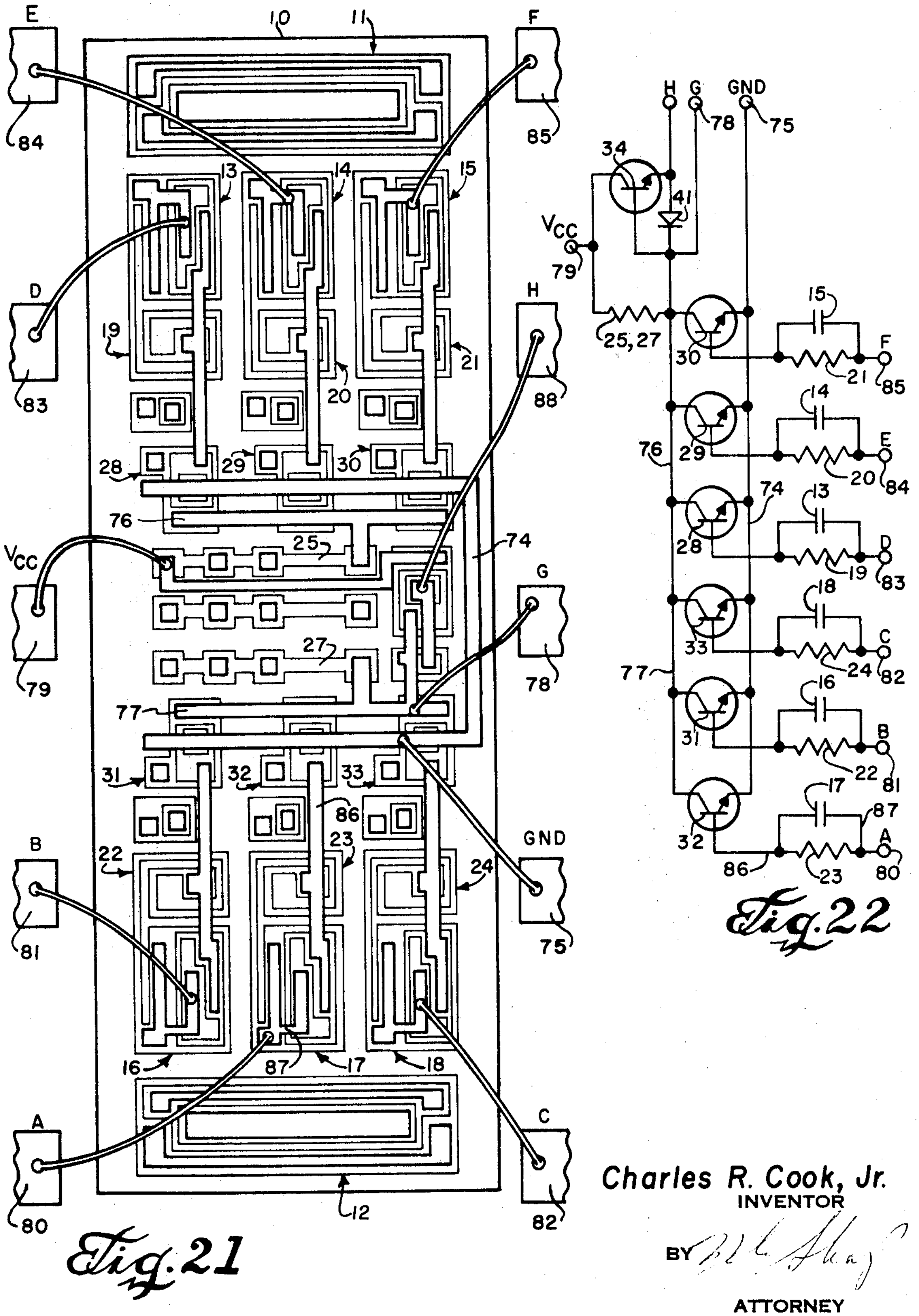
FIG. 21 is a top view of a master wafer of FIG. 1 after the conductive lead pattern has been established to form a NOR logic circuit.
FIG. 22 is a schematic diagram of the NOR logic circuit provided by the semiconductor network of FIG. 21.
Figures 23, 25:
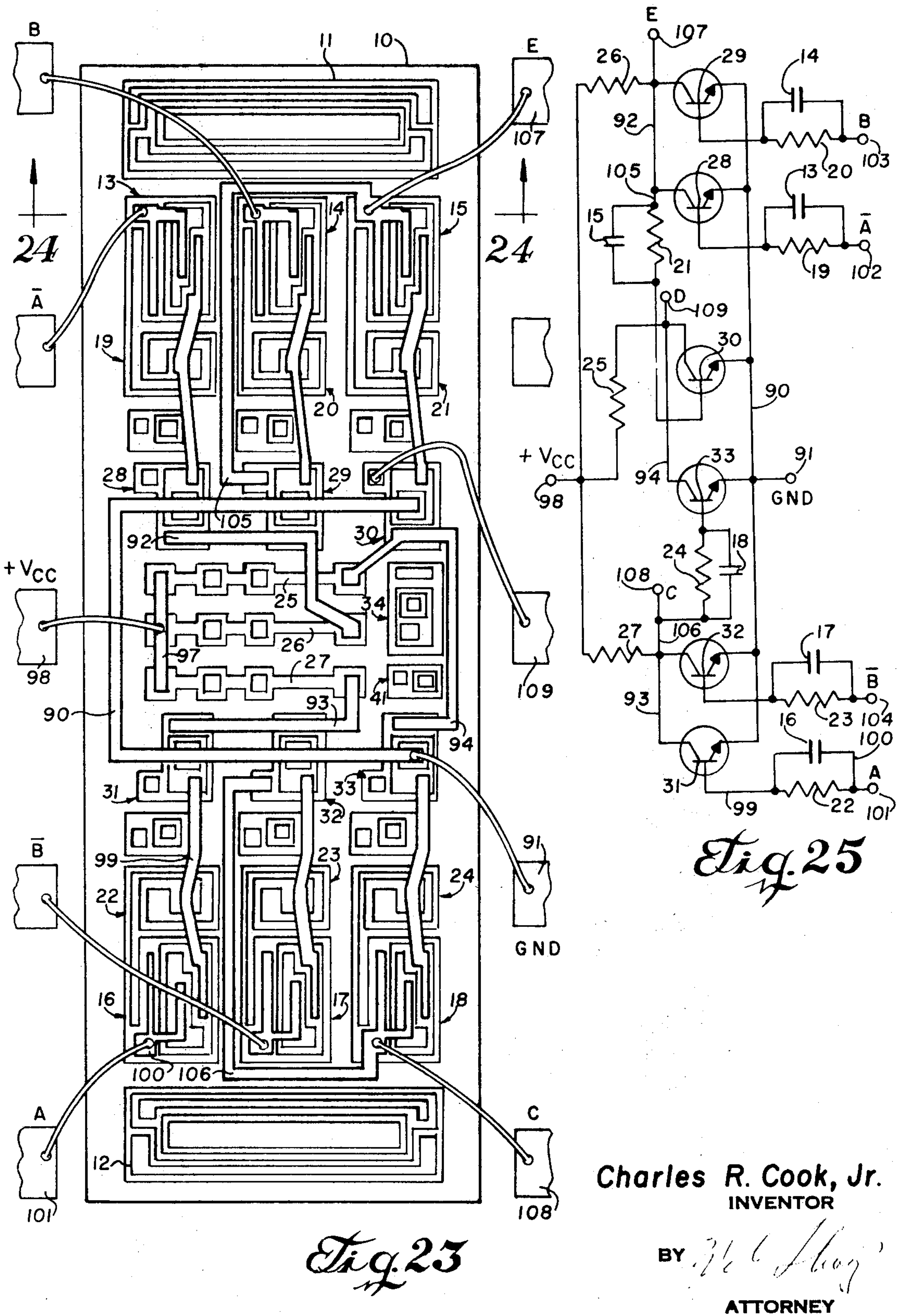
FIG. 23 is a top view of a master wafer of FIG. 1 after the conductive lead pattern has been established to form an "Exclusive OR" logic circuit.
FIG. 25 is a schematic diagram of the circuit provided by the semiconductor network of FIG. 23.
Figure 26:
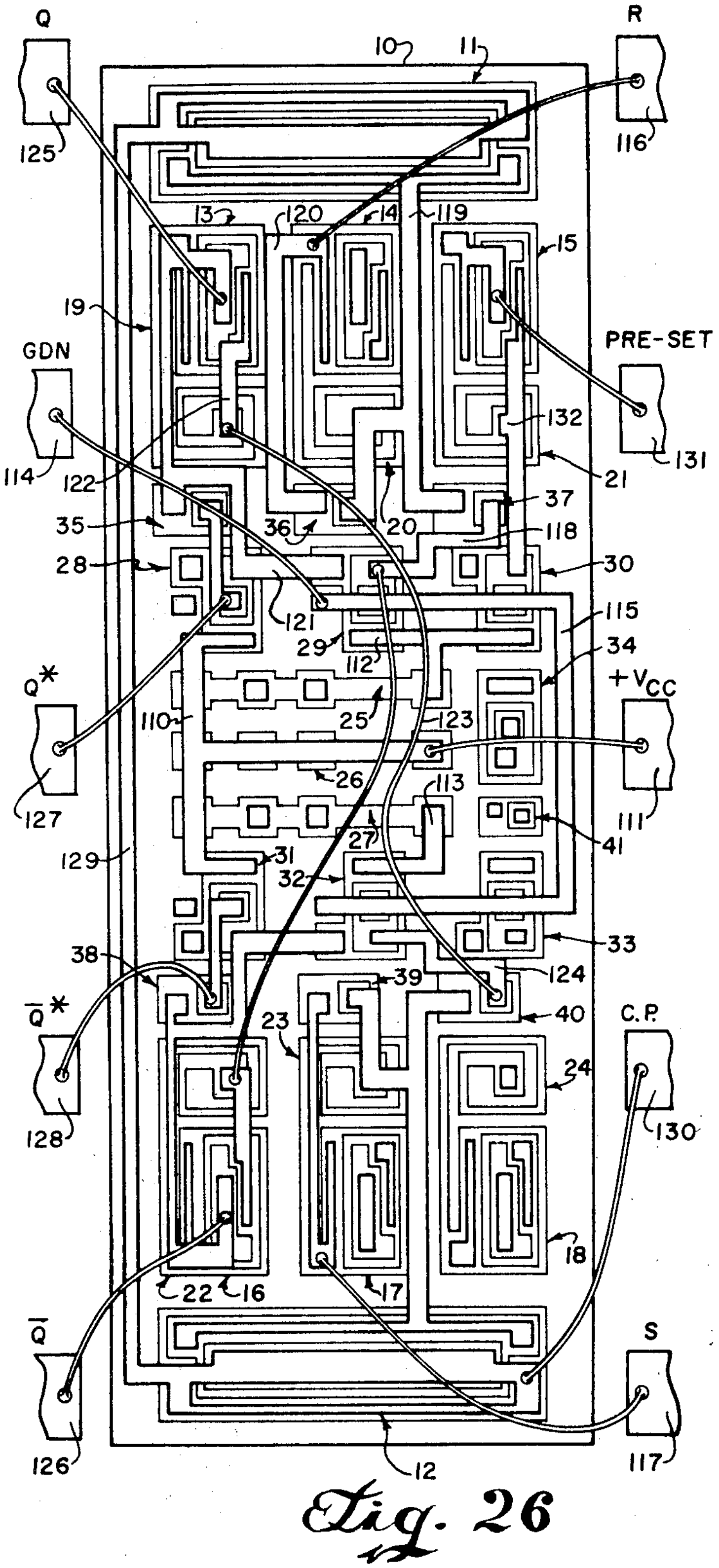
FIG. 26 is a top view of a master wafer of FIG. 1 after a conductive lead pattern has been established to provide a flip-flop or bistable multivibrator network.
Figure 28:
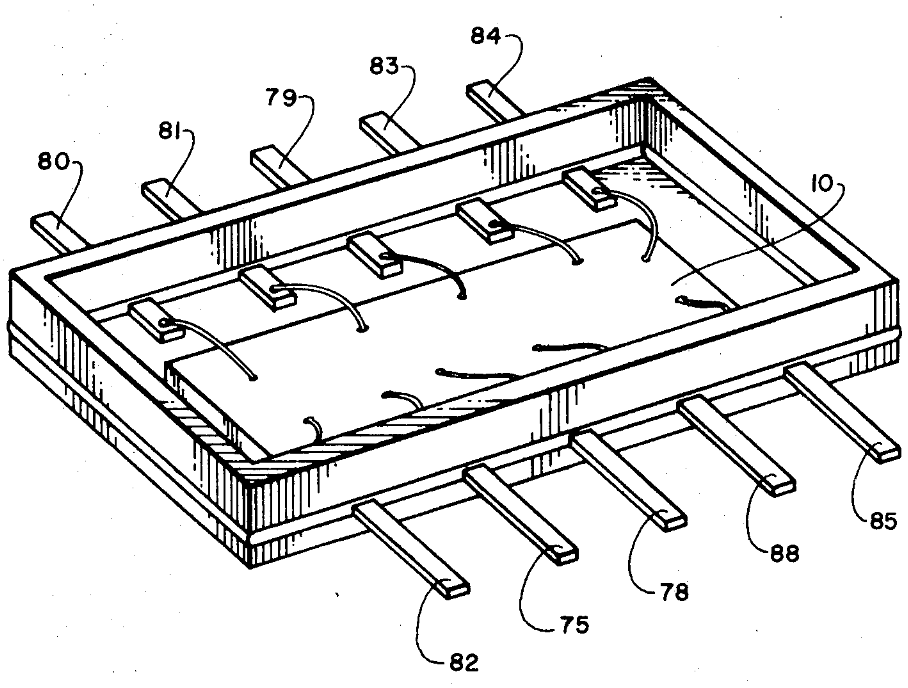
FIG. 28 is a pictorial view of one of the semiconductor networks of FIG. 21 after packaging.

To establish any one of the desired lead patterns, such as those shown in FIGS. 21, 23 and 26, a slice including many of the FIG. 1 units, after an aluminum coating is applied to the top surface, is first coated with a photosensitive resist material and exposed to light through a mask which allows light to strike the areas where it is desired that aluminum remain. The resist material is then developed, removing the unexposed portions. The slice is placed in a sodium hydroxide etch which attacks the exposed aluminum but not the resist material or the silicon oxide. The aluminum film is thus removed except in the contact areas or the interconnecting lead strips. The remaining resist material is removed, and the back of the slices is then etched to the proper thickness of about 4 mils. The slice is scribed and broken into individual wafers 10, then the wafers are mounted in packages such as shown in FIG. 28 and in the copending application Ser. No. 811,470, filed May 6, 1959, and assigned to the assignee of the present invention. After mounting, 1-mil gold lead wires are ball-bonded to interconnect the appropriate contacts on the wafer to tabs which extend into the package, and a cap is applied to the package.

Referring now to FIG. 21, a master wafer 10 is shown with a lead pattern which forms a NOR logic circuit as illustrated in FIG. 22. Here all of the transistors 28—33 have their emitters connected together by an aluminum strip 74 which is connected by a ball-bonded lead wire to a tab 75, this tab being grounded in operation of the circuit. The collectors of the transistors are all connected together by strips 76 and 77, both of which are connected to a tab 78 by ball-bonded wires. This tab 78, marked G, may provide the output terminal for the logic circuit. The strip 76 extends to a contact on one end of the resistor 25, while the other end of this resistor is connected by a wire to a tab 79 which is connected to a collector supply $V_{cc}$ in operation. The resistor 25 thus functions as a load resistor, and a portion of the resistor 27 may be connected in shunt therewith to provide some reduction of the load resistor value. This is done by having a portion of the strip 77 extend onto one end of the resistor 27, while one of the contacts on the other end may be connected by a wire (not shown) to a contact on the end of the resistor 25. The base of each of the transistors 28—33 is connected through a different one of the resistors 19—24 to one of a set of input tabs 80—85, providing logic fan-ins designated A through F. Each of the resistors 19—24 is shunted by the corresponding one of the capacitors 13—18. The transistor 32, for example, has its base connected by an aluminum strip 86 to one end of the spiral-shaped resistor 23, while this strip extends to the contact on the center P-type region of the capacitor 17. The upper and lower N-type regions of the capacitor 17 are connected together by an aluminum strip 87, and this strip is connected to the tab 80 by a wire. The base input arrangements for the other transistors are similar to the input for the transistor 32. It is seen that none of the diodes 35—37 are used, nor are the capacitors 11 and 12 connected in the circuit. The transistor 34 and the diode 41 are connected in shunt across the load resistor to provide an optional emitter-follower output at a terminal H or tab 88.

In operation, the semiconductor network of FIGS. 21 and 22 provides NAND or NOR logic functions, depending upon whether a binary one is assumed to be positive or negative. If 1 is positive, NOR (not OR) operation results, meaning than an output 0 is produced at G or H if at least one of the inputs A, B, C, D, E or F at tabs 80—85 has a 1 or positive voltage applied thereto. The logic function may be expressed as H or $G=\overline{A+B+C+D+F}$. Alternatively, if 1 is negative (or any voltage inadequate to turn on one of the transistors 28—33), NAND (not AND) operation is provided since an output 0 is produced only if all of the inputs A, B, C, D, E and F have a 1 or negative voltage applied thereto. This operation may be expressed as $G=\overline{ABCDEF}$ or $H=\overline{ABCDEF}$.

In FIG. 23, one of the master wafers 10 is shown having a pattern of interconnecting leads to form an "Exclusive OR" logic circuit, the schematic diagram of which is seen in FIG. 25. All of the emitters for the transistors 28—33 are again connected together by an evaporated metal strip 90 which is coupled to a tab 91 by a wire ball-bonded at its end to the strip and tab. The transistors are grouped in pairs which share a load resistor, the transistors 28 and 29 having their collectors connected together by a strip 92 which extends over to one end of the resistor 26, while the transistors 31 and 32 have a similar connecting strip 93 coupling the collectors to the resistor 27. The transistors 30 and 33 similarly have their collectors connected together and to one end of the resistor 25 by a strip 94. The left-hand ends of the resistors 25—27 are connected together by a strip 97 which is coupled by a wire to a tab 98 that provides the collector supply $V_{cc}$ in operation. The base of each of the transistors 28—33 is connected to one end of a different one of the resistors 19—24 by separate metal strips overlying the oxide coating. As above, each of the resistors 19—24 is shunted by its associated one of the capacitors 13—18. The input to the transistor 31, for example, comprises a metal strip 99 connecting the base to one end of the resistor 22 and to the center region of the capacitor 16. The N-type regions of the capacitor, and the other end of the resistor, are connected together by a metallic member 100 which is coupled by a wire to a tab 101, providing a logic input A. The inputs to the transistors 28, 29 and 32 are similarly arranged, providing logic inputs $\overline{A}$, B and $\overline{B}$ at tabs 102, 103 and 104, respectively. The input arrangements for the transistors 30 and 33 include the same RC circuits as for the other transistors, but these are connected to the collectors of the transistors 29 and 32 by conductive strips 105 and 106, respectively. These strips 105 and 106 are further connected by wires to tabs 107 and 108, respectively, providing auxiliary logic outputs C and E. The other collector contact for the transistor 30 is connected by a wire to a tab 109, providing the main "Exclusive OR" logic output D.

Figures 16, 17, 18, 19, 20, 24:
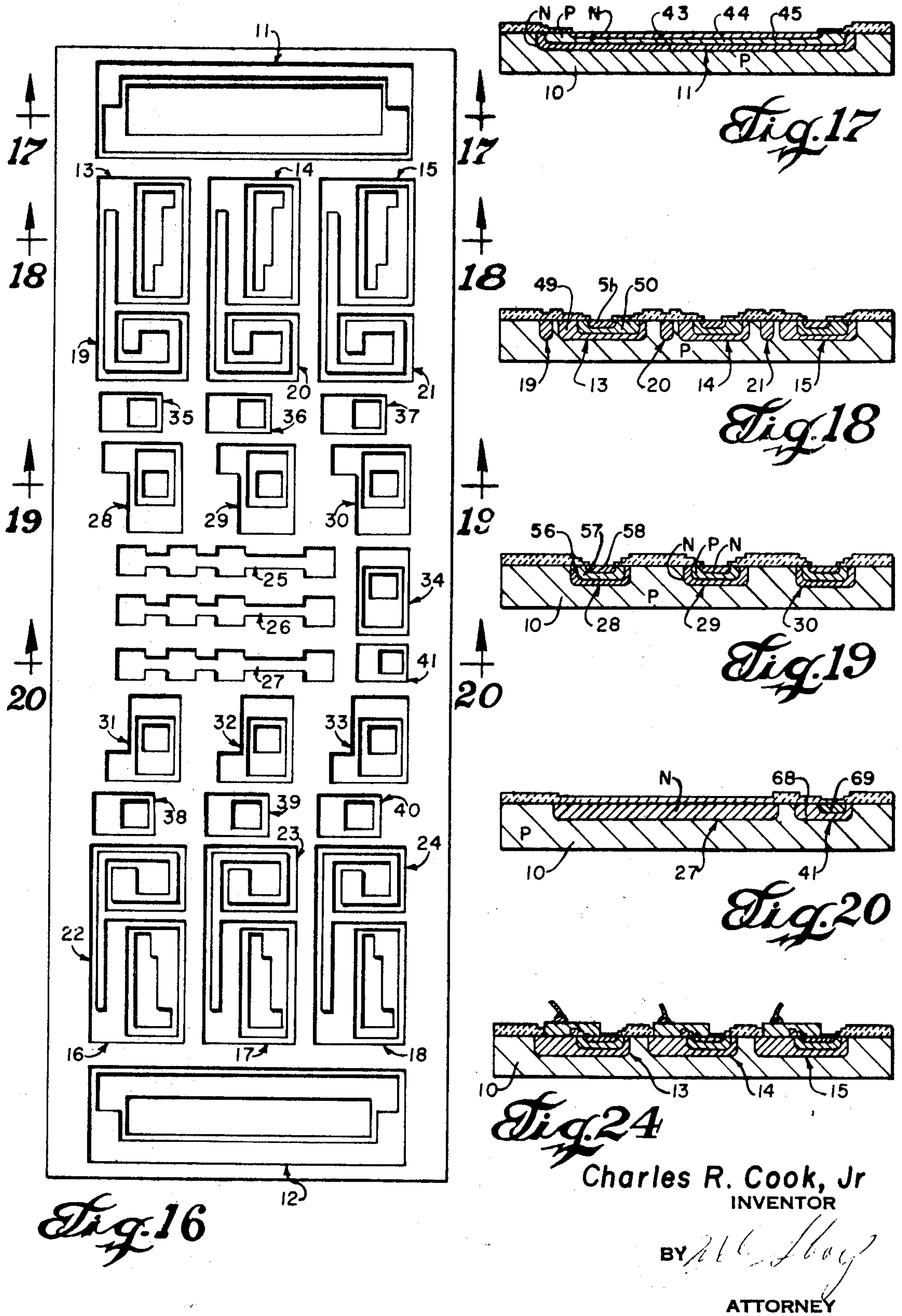
FIG. 24 is a sectional view of the semiconductor network of FIG. 23 taken along the lines 24-24 of FIG. 23.

The network of FIG. 23 is seen in cross section in FIG. 24, where the evaporated metal leads overlying the oxide coating are illustrated. This sectional view is not to scale, the thickness of the oxide and metal films being much smaller in relation to the wafer.

In operation, the semiconductor network of FIGS. 23—25 can provide a variety of logic functions. Assuming a binary zero to be a positive voltage adequate to cut on one of the transistors, and a binary one to be ground or negative to ensure that its presence will cut off a transistor, the network provides several functions in NAND (not AND) logic. At C, tab 108, the voltage will be high, signifying 0, only when A is one and $\overline{B}$ is one. This may be expressed $C=\overline{A}+B$. At output D, "Exclusive OR" (NAND logic) results since the voltage at D or tab 109 will be high or at binary zero only when either A or $\overline{B}$ is 0 and either $\overline{A}$ or B is 0. This logic arrangement may be expressed $D=A\overline{B}+B\overline{A}$. At E, tab 107, a one is present when either $\overline{A}$ is 0 or B is 0, providing a NAND logic function $E=A+\overline{B}$. Alternatively, if a binary zero is assumed to be ground or a low voltage and one to be a higher positive voltage, "Exclusive OR (NOR logic)" is provided if the B and $\overline{B}$ inputs are interchanged. Here the logic functions expressed $C=\overline{AB}$, $D=A\overline{B}+\overline{A}B$ and $E=AB$ result.

Figure 27:
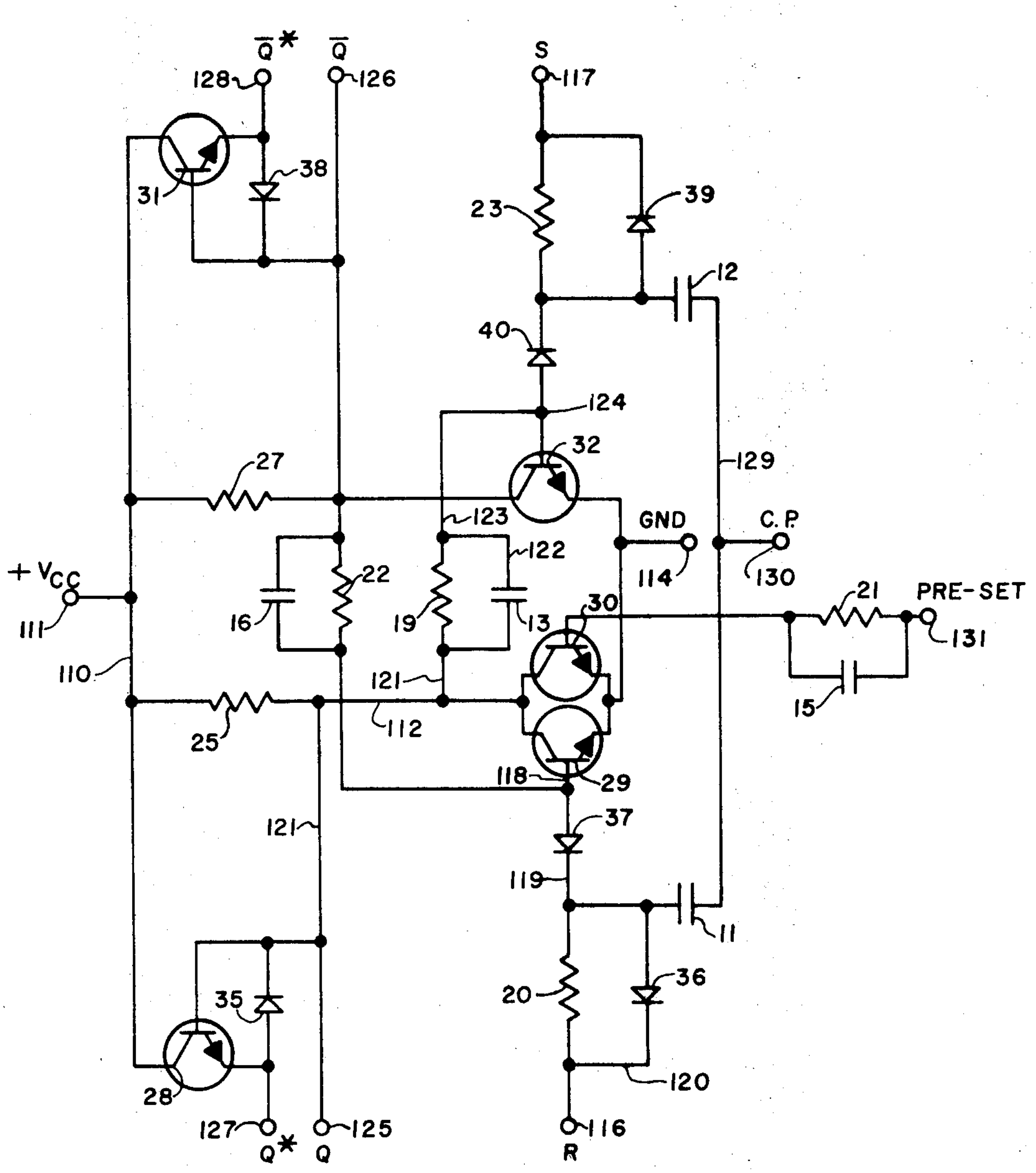
FIG. 27 is a schematic diagram of the circuit provided by the semiconductor network of FIG. 26.

With reference to FIG. 26, an interconnecting lead pattern for a wafer 10 is illustrated which provides a so-called "R–S" or reset-set flip-flop circuit as shown in FIG. 27. Here a metal strip 110 overlying the oxide coating makes ohmic contact through holes in the oxide to one end of each of the resistors 25 and 27 and to the collectors of the transistors 28 and 31. This strip 110 is connected by a wire to a tab 111 to which is applied the operating bias voltage $+V_{cc}$. The other end of the resistor 25 is connected to the collectors of the transistors 29 and 30 by a strip 112, while the remaining end of the resistor 27 is connected to the collector of the transistor 32 by a strip 113. The emitters of the transistors 29, 30 and 32 are connected together and to a grounded tab 114 by a strip 115 and associated wire. The transistors 29 and 32 are the primary active elements of the flip-flop, with inputs to these transistors being the R and S tabs 116 and 117. The base of the transistor 29 is connected to the P-type region of the diode 37 by a strip 118, with the other region of the diode being connected by a strip 119 to one end of the resistor 20, to the P-type region of the diode 36, and to the center region of the large capacitor 11. The other end of the resistor 20, which is connected to the N-type side of the diode 36 by a strip 120, is connected by a wire to the R input tab 116. A similar input arrangement is provided for the base of the transistor 32 through the diode 40, and the parallel combination of the resistor 23 and the diode 39, to the S input tab 117. Cross-coupling is provided by connecting the collectors of the transistors 29 and 32 to the opposite bases. Thus, the collector of the transistor 29 is connected by a strip 121 to one side of the parallel combination of the resistor 19 and the capacitor 13. The other terminals of this resistor and capacitor are connected together by a strip 122, which is connected by a wire 123 to a strip 124 coupled to the base of the transistor 32, similar cross-coupling connections are made between the collector of the transistor 32 and the base of the transistor 29 through the resistor 22 and the capacitor 16. Outputs are provided from the collectors of the transistors 29 and 32 at tabs 125 and 126 which represent Q and $\overline{Q}$, respectively, in logic terms. Similar outputs are provided at Q* and $\overline{Q}$* on tabs 127 and 128, through emitter-follower arrangements including the transistors 28 and 31 along with the diodes 35 and 38. A clock pulse or "C.P." input is provided to the bases of the transistors 29 and 32 through the large capacitors 11 and 12 which have their outer regions tied together by a long strip 129, this strip being coupled to a tab 130 by a wire. The transistor 30, shunting the transistor 29, provides a preset input at a tab 131 which is connected to the base of this transistor through the capacitor 15 and the resistor 21 along with a metal strip 132. It is seen that all of the components are used in this flip-flop circuit except the capacitors 14, 17 and 18, the resistors 24 and 26, the transistors 32 and 34 and the diode 41.

In operation of the semiconductor network of FIGS. 26 and 27 as a reset-set flip-flop, assume that a low voltage represents a binary one, and that periodic positive clock pulses are applied to the C.P. tab 130. Before a clock pulse, the flip-flop may be preset to one by a positive pulse applied to the tab 131, turning on the transistors 30 and 29 and turning off the transistor 32. The output Q is now one or low. If R and S are now 0 or high, the next clock pulse will not change the state of the flip-flop. If R is 0 or high and S is 1 or low, the next clock pulse will merely tend to switch the state to 1, where it exists already. If R is 1 and S is 0, however, the next clock pulse will be sufficient, coupled into the anode side of the diode 40, to turn on the transistor 32 and turn off the transistor 29, resulting in a 0 state or high voltage at Q. A shift register may be provided by a plurality of these networks by connecting the R input of each network to the $\overline{Q}$ tab 126 of the previous network and connecting the S input to the Q tab of the previous network.

In FIG. 28, the network of FIG. 21 is seen in a package as referred to above. The wafer 10 with the evaporated lead pattern is cemented to a ceramic wafer 134 by a material such as solder glass. Prior to this, the ceramic wafer has had a ceramic ring 135 secured thereto by solder glass with the tabs 75, 78—85 and 88 extending through the sealing material 136. The appropriate lead wires are connected from the portions of the tabs exposed on the inside of the package to the contact regions on top of the wafer after the semiconductor wafer is cemented to the ceramic wafer. A protective material such as varnish may then be applied to the wafer surface and leads. A cap or plate, not shown, is then secured to the top of the package, covering the opening and resulting in a hermetically sealed unit. The overall dimensions of the package may be one-fourth inch in length and one-eighth inch in width, exclusive of the lead tabs. The thickness would be perhaps 35 mils and the weight 0.05 gram. This package is of course only one example, since the devices may be placed in many suitable packaging arrangements, such as a transistor-type header and can.

The three circuits described above provide basic functional blocks for any digital system and are useful in many different applications, but these three circuits by no means exhaust the possibilities presented in the master wafer of this invention. Many other circuits may be produced at slight additional cost, each new circuit merely requiring a modified photomask for the aluminum mask and etch step. Thus, a wide variety of integrated circuits, from simple amplifiers and gates to complex logic arrangements or multivibrators, may be produced even in small volumes at economical costs.

The semiconductor material used in the preferred embodiment above is silicon, but obviously other semiconductive substances, such as germanium or the III—V compounds, may prove advantageous for other purposes. Also, while the silicon oxide masking coupled with planar geometry is particularly compatible with the evaporated aluminum leads and contacts, other fabrication techniques and materials may be suitable.

Therefore, while the invention has been described with reference to a particular embodiment, this description is not meant to be construed in a limiting sense, but only illustrative of the principles involved. Various modifications of the embodiment described above, as well as other embodiments of the invention, will be apparent to persons skilled in the art upon reading this specification. Accordingly, it is contemplated that the appended claims will cover any such modifications or embodiments as fall within the true scope of the invention.

I claim:

1. An intermediate structure in the fabrication of semiconductor devices from which a wide variety of integrated electronic circuits may be formed comprising:

a. a wafer of single crystal semiconductor material having a major face, b. a first plurality of each of a variety of diverse semiconductor components formed adjacent a first area of the major face by alternate layers of semiconductor material of opposite conductivity types, each of the components having at least two regions defining electrodes of the component exposed at the major face, the components being laterally spaced from one another and isolated by PN junction, c. a second like plurality of each of a variety of diverse semiconductor components formed adjacent a different area of the major face by alternate layers of semiconductor material of opposite conductivity types, each of the components having at least two regions defining electrodes of the component exposed at the major face, the second plurality of components being laterally spaced from one another and isolated by the PN junctions, d. an insulating coating on the major face covering said first area of the surface thereof and said different area of the surface thereof except at exposed contact areas overlying said electrode regions, e. a first pattern of conductive material on said major face overlying the insulating coating on said first area and ohmically contacting each of the electrode regions of said first plurality of components and forming a first electronic circuit, f. a second pattern of conductive material on said major face overlying the insulating coating on said different area and ohmically contacting each of the electrode regions of said second plurality components and to form a different electronic circuit, g. said first plurality and second like plurality of components being laid out in substantially the same pattern in said first area and said different area of the major face.

2. A structure according to claim 1 wherein the semiconductor components include transistors, diodes and resistors, all of which are planar in form and have PN junctions extending to said major face underneath said insulating coating.

3. A master semiconductor device from which any one of a wide variety of different integrated electronic circuits may be formed comprising:

a. a wafer of monocrystalline silicon, b. a first plurality of each of a wide variety of diverse semiconductor components formed adjacent to a first area of a major face of the wafer by alternate diffused layers of opposite conductivity types, each of the components having at least two regions defining electrodes of the component exposed at the major face, the components being laterally spaced from one another in a first regular pattern and isolated by PN junctions, c. a second like plurality of each of a variety of diverse semiconductor components formed adjacent a different area of said major face of the wafer by alternate diffused layers of opposite conductivity types, each of the components of said second plurality having at least two regions defining electrodes of the component exposed at the major face, the components of said second plurality being laterally spaced from one another in a regular pattern substantially the same as said first regular pattern and isolated by PN junctions, d. a coating of silicon oxide on the major face covering said first area of the surface thereof and said different area of the surface thereof, except at exposed areas overlying said electrode regions, e. first thin film pattern of aluminum on said major face overlying the silicon oxide covering said first area and ohmically contacting each of the electrode regions of said first plurality of components and forming a first electronic circuit, and f. a second thin film pattern of aluminum on said major face overlying the silicon oxide type covering said different area and ohmically contacting each of the electrode regions of said second plurality of components and forming a different electronic circuit.

4. A master semiconductor device according to claim 3 wherein the semiconductor components include transistors, diodes, resistors, and capacitors, all of which are planar in form and have PN junctions extending to said major face underneath said silicon oxide.

5. A plurality of different electronic circuits on a common semiconductor substrate comprising:

a. a semiconductor substrate, b. a first plurality of circuit components formed adjacent to a first area of a major face of said semiconductor substrate, at least some of said circuit components of said first plurality including semiconductor portions of said substrate having conductivity types opposite that of subjacent semiconductor material, said circuit components of said first plurality arranged with respect to one another in a predetermined pattern at said first area and isolated from one another through the semiconductor material, c. a second like plurality of circuit elements formed adjacent a different area of said major face of said substrate, at least some of said circuit elements of said second plurality including semiconductor portions of said substrate having conductivity types opposite that of subjacent semiconductor material, said circuit components of said second plurality being arranged with respect to one another at said different area in substantially the same predetermined pattern as said first plurality of circuit components and being isolated from one another through the semiconductor material, d. insulating material on said major face of said substrate covering said first area and said different area except at exposed contact areas overlying electrode regions of said circuit components, e. a first pattern of conductors on said insulating material covering said first area and ohmically connecting to the circuit components of said first plurality at said contact areas in said first area to form a first electronic circuit, and f. a different pattern of conductors on said insulating material covering said different area and ohmically connecting to the circuit components of said second plurality at said contact areas in said different area to form a different electronic circuit.

6. A semiconductor structure comprising a semiconductor substrate, a plurality of substantially identical spaced units on one surface of said substrate, each unit comprising a number of circuit elements for providing active and passive circuit element functions sufficient to form different circuit functions, insulating material on said one surface of said substrate exposing contact areas for interconnecting the circuit elements of each unit, conductive material on said insulating material interconnecting the circuit elements of one unit to form a circuit function and interconnecting the circuit elements of another unit to form a different circuit function.

7. A structure according to claim 6, wherein said circuit elements of a unit comprise transistors and diffused resistors.

8. A structure according to claim 6, wherein said circuit elements of a unit comprise transistors, diffused resistors and diodes.

9. A structure according to claim 6, wherein said circuit elements of a unit comprise transistors, diffused resistors, diodes and capacitors.